US006326268B1

(12) United States Patent
Park et al.

(10) Patent No.: US 6,326,268 B1
(45) Date of Patent: Dec. 4, 2001

(54) METHOD OF FABRICATING A MONOS FLASH CELL USING SHALLOW TRENCH ISOLATION

(75) Inventors: Steven K. Park, Austin, TX (US); Fei Wang, San Jose; Bharath Rangarajan, Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/426,427

(22) Filed: Oct. 25, 1999

(51) Int. Cl.[7] .................................... H01L 21/8247
(52) U.S. Cl. .................................... 438/262; 438/261
(58) Field of Search .................................... 438/257–267

(56) References Cited

U.S. PATENT DOCUMENTS 6,242,305 * 6/2001 Foote et al. .

* cited by examiner

*Primary Examiner*—Richard Booth
(74) *Attorney, Agent, or Firm*—Amin & Turocy, LLP

(57) ABSTRACT

A process for fabricating a MONOS Flash cell device having a bit-line includes providing a semiconductor substrate and growing a pad silicon oxide layer overlying the semiconductor substrate. Thereafter, a silicon nitride layer is formed overlying the pad silicon oxide layer. A shallow trench isolation etch is performed to form a trench in the semiconductor substrate. Thereafter, a silicon oxide is deposited to fill the trench. To planarize the silicon oxide to an upper of the silicon nitride layer, a chemical-mechanical-polishing process is performed. Thereafter, the silicon nitride layer and the pad silicon oxide layer are removed, and an oxide-nitride-oxide layer is deposited to overlie the semiconductor substrate.

21 Claims, 2 Drawing Sheets

10
14
18
12
18
18
16
16
16
17

20
34
32
30
22
30
28
28
24
26

40
40
38
38
36
36
28
28
24
26

43
43
42
38
38
36
36
28
28
24
26

43
38
38
36
36
22
28
28
24
26

22
28
28
24
26

48
46
30
22
44
28
28
24
26

METHOD OF FABRICATING A MONOS FLASH CELL USING SHALLOW TRENCH ISOLATION

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,205, now U.S. Pat. No. 6,248,635. "PROCESS FOR FABRICATING A BIT-LINE IN A MONOS DEVICE USING A DUAL LAYER HARD MASK".

U.S. patent application Ser. No. 09/427,402, now U.S. Pat. No. 6,117,730. "INTEGRATED METHOD BY USING HIGH TEMPERATURE OXIDE FOR TOP OXIDE AND PERIPHERY GATE OXIDE".

U.S. patent application Ser. No. 09/427,404, now U.S. Pat. No. 6,242,305. "PROCESS FOR FABRICATING A BIT-LINE USING BURIED DIFFUSION ISOLATION".

U.S. patent application Ser. No. 09/426,743. "PROCESS FOR FORMING A BIT-LINE IN A MONOS DEVICE".

FIELD OF THE INVENTION

The invention relates generally to the fabrication of semiconductor devices and, more particularly, to the fabrication of the dielectric layers in semiconductor devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. During programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain.

A Flash device that utilizes the ONO structure is a Metal-Oxide-Nitride-Oxide-Silicon (MONOS) cell. Referring to FIG. 1, a known MONOS cell, generally referred to as 10, includes at least one bit-line oxide 12, a word line 14 and an ONO structure 16 which function together to determine the location of a charge stored in memory. The bit-line oxide 12 and the ONO structure 16 overlie a silicon wafer 17.

A problem exists with known MONOS cell fabrication techniques in that as the MONOS cells decrease in size, formation of the bit-line oxide 12 causes a bird's beak 18 of the ONO structure 16 to form and increasingly encroach the word line 14. The bird's beak 18 is an undesired result of the fabrication process for several reasons. For example, the bird's beak 18 causes an increase in surface area which enlarges the circuit. In addition, at a performance level, the bird's beak 18 can induce fatal stress damage to the silicon wafer 17, especially during bit-line oxidation steps. The stress results, for example, from a mismatch in thermal expansion properties between the ONO structure 18 and the silicon wafer 17.

Therefore, while recent advances in MONOS cell technology have enabled memory designers to reduce the size of the MONOS cells, numerous challenges exist in the fabrication of material layers within these devices. In particular, a fabrication process of MONOS cells should accommodate a reduction in size of the MONOS cell while avoiding a bird's beak formation. Accordingly, advances in MONOS cell fabrication technology are necessary to eliminate the bird's beak and insure high quality MONOS cell devices.

SUMMARY OF THE INVENTION

Such needs are met or exceeded by the present method for fabricating a MONOS cell. According to an aspect of the present invention, an unwanted bird's beak feature of the MONOS cell can be eliminated. It follows that stress damage can be eliminated to the semiconductor substrate caused by the bird's beak. In addition, the size of the transistor can be reduced, to reduce an overall size of the circuit.

More specifically, in one form, a process for fabricating a bit-line structure for a MONOS cell includes providing a semiconductor substrate and growing a pad silicon oxide layer overlying the semiconductor substrate. Thereafter, a silicon nitride layer is formed overlying the silicon oxide layer. A shallow trench isolation etch is performed to form a trench in the nitride layer, the silicon oxide layer, and the semiconductor substrate. Thereafter, a silicon oxide is deposited to overfill the trench. To planarize the silicon oxide to an upper surface of the silicon nitride layer, a chemical-mechanical-polishing process is performed. Thereafter, the silicon nitride layer and the pad silicon oxide layer are removed, and an oxide-nitride-oxide layer is deposited to overlie the semiconductor substrate.

BRIEF DESCRIPTION OF THE DRAWINGS

Other features and advantages of the invention will be apparent to those skilled in the art with reference to the detailed description and the drawings, of which.

Figure 1:
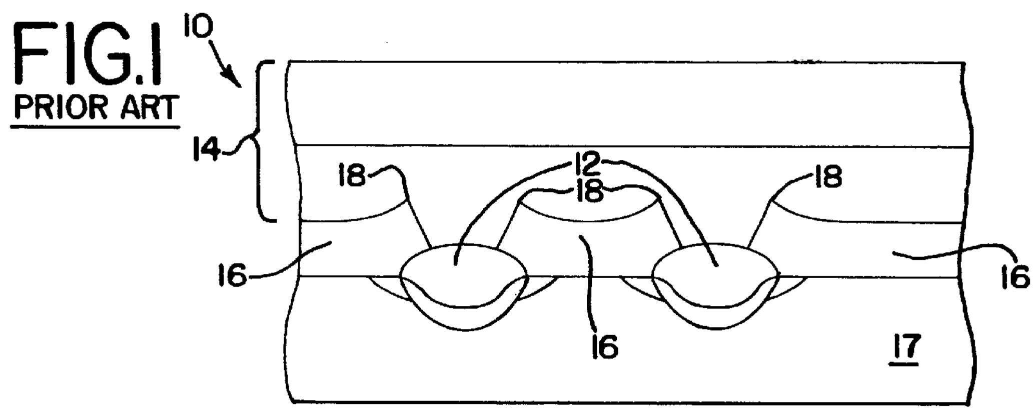
FIG. 1 illustrates, in cross-section, a portion of a known MONOS cell that includes an ONO structure with bird's beak formations.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

Figure 2:
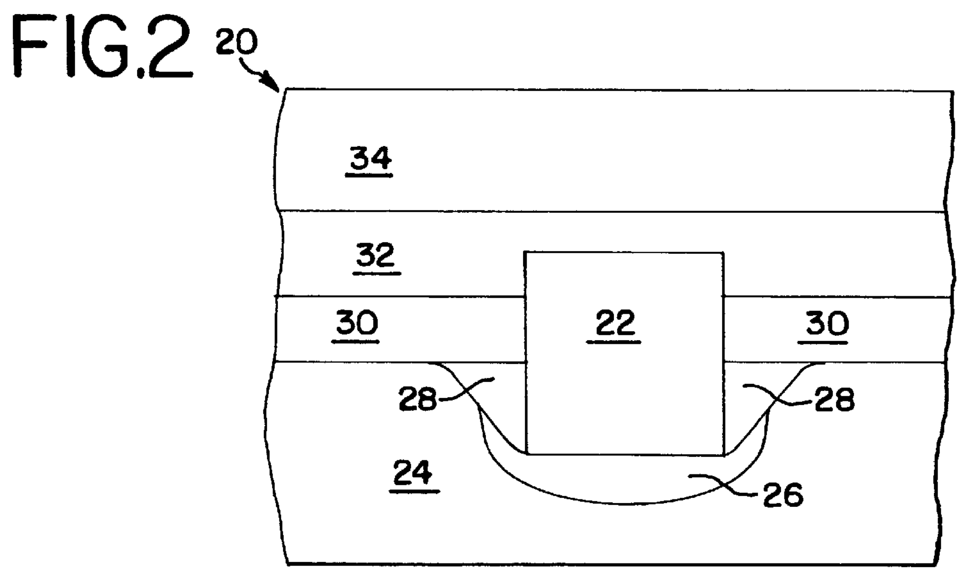
FIGS. 2–7 illustrate, in cross-section, process steps for the fabrication of a MONOS cell in accordance with embodiments of the invention.

Referring to the figures, and in particular FIG. 2, a memory portion of a MONOS Flash cell 20 is shown in cross-section which is suitable for use in EEPROM and Flash devices. MONOS cell 20 includes at least one bit-line oxide region 22 located in a semiconductor substrate 24, such as a silicon wafer. Bit-line oxide region 22 overlies an arsenic region 26 and boron regions 28 which are implanted into the semiconductor substrate 24. Overlying semiconductor substrate 24 is an ONO structure layer 30. To further complete the memory portion of the MONOS device, a polycrystalline silicon layer 32 overlies the ONO layer 30 and the bit-line oxide 22. In addition, a silicide layer 34, made of tungsten for example, overlies the polycrystalline silicon layer 32.

Those skilled in the art will recognize that the proper functioning of a MONOS cell device necessarily requires that an electrical charge remain isolated in the regions of a silicon nitride layer of the ONO structure 30 to which it is initially introduced. In particular, the quality of ONO structure 30 must be such that charge leakage paths are minimized In accordance with the invention, charge leakage within ONO structure 30 is minimized by eliminating a bird's beak formation common in known MONOS devices. The elimination of the bird's beak formation obtained by the present invention can be better understood following a description of a MONOS fabrication process carried out in accordance with the invention.

Figure 3:
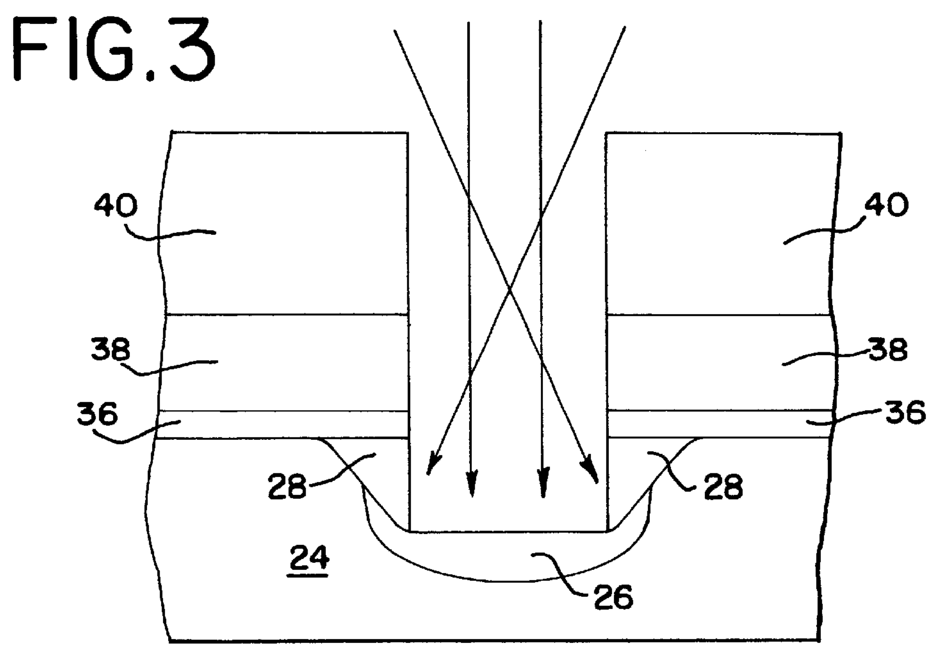

Referring now to FIG. 3, a pad silicon oxide layer 36 is formed to overlie the semiconductor substrate 24. Preferably, an oxidation process is carried out until the pad silicon oxide 36 has a thickness of about 50 to about 500 angstroms. The oxidation process can be carried out, for example, in either a batch-thermal oxidation furnace, or alternatively, in a single-wafer oxidation apparatus.

Thereafter, a silicon nitride layer 38 is formed to overlie the pad silicon oxide layer 36. The silicon nitride layer 38 is utilized as a chemical-mechanical-polishing (CMP) process stopping layer during a CMP fabrication step described below. In one embodiment, the nitride layer 38 should be thick enough to avoid boron and arsenic from penetrating the semiconductor substrate 24 during a boron and arsenic implant described below. Therefore, silicon nitride is deposited to form the silicon nitride layer 38 which preferably has a thickness of at least 1000 angstrom, and more preferably a thickness of about 2000 to about 3000 angstroms.

After forming the silicon nitride layer 38, a resist layer 40 is formed overlying the silicon nitride layer 38 to mask a core source/drain region (not shown) of the MONOS cell 20 for source/drain production. In another embodiment, described below, the resist layer 40 is also formed to mask the bit-line region 22. After forming the source/drain regions, a shallow trench isolation (STI) etch is utilized to form a trench in the semiconductor substrate 24 for the bit-line region 22. Preferably, the trench has a depth of about 300 to about 5000 angstroms into the semiconductor substrate 24, and more preferably the trench has a depth of about 2000 angstroms.

Thereafter, the resist layer 40 is removed and boron and arsenic are implanted into the semiconductor substrate 24. The boron is implanted at a high angle, typically about twenty-five degrees to form boron regions 28. In addition, arsenic is implanted at a low angle, typically about zero to about seven degrees, to form arsenic region 26.

In another embodiment, to reduce a thickness of the silicon nitride 38, the boron and arsenic are implanted before the resist layer 40 is removed. Since the boron and arsenic are implanted before the resist layer 40 is removed, the nitride layer 38 can be thinner than the nitride layer 38 in the above described embodiment. Therefore, the silicon nitride layer 38 preferably has a thickness of about 100 to about 1000 angstroms, and more preferably has a thickness of 500 angstroms. A rapid-thermal-chemical-vapor-deposition (RTCVD) process, for example, is carried out for a period of time and at gas flow rates sufficient to form a silicon nitride layer of the desired thickness.

Figure 4:
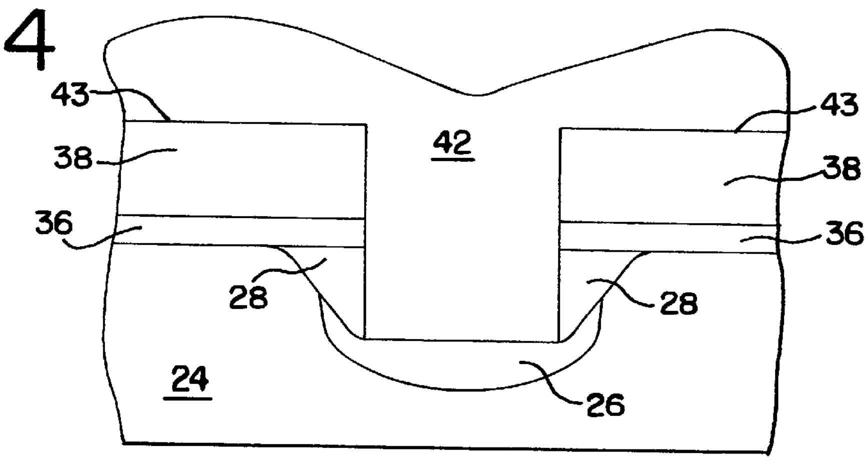

Referring to FIG. 4, after the boron and the arsenic are implanted using either of the above described embodiments, the trench formed by the STI process is overfilled with a silicon oxide layer 42. In one embodiment, the gap is filled using a plasma-enhanced-chemical-vapor-deposition (PECVD) process. The PECVD process is carried out at a temperature of about 400° C. The process typically is carried out with a mixture of ozone and tetra-ethyl-ortho-silane (TEOS) gas, for a period of time sufficient to form a silicon oxide layer 42 that overfills the trench formed by the STI process.

Thereafter, a thermal anneal process is performed to densify, and therefore stabilize, the silicon oxide layer 42, and activate the implanted boron and arsenic. Preferably, the annealing process is performed at about 900° C.

Alternatively, the silicon oxide layer 42 is formed by utilizing a high density plasma (HDP) process. The HDP process automatically densifies the silicon oxide layer 42. The HDP process eliminates the need for thermal annealing. Since the anneal process is eliminated, the implanted boron and arsenic can be activated during a periphery gate oxidation step, described below.

Figure 5:
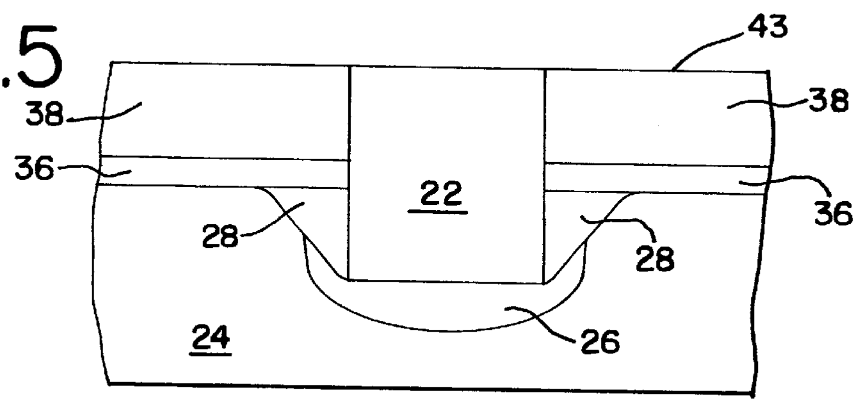
Figure 6:
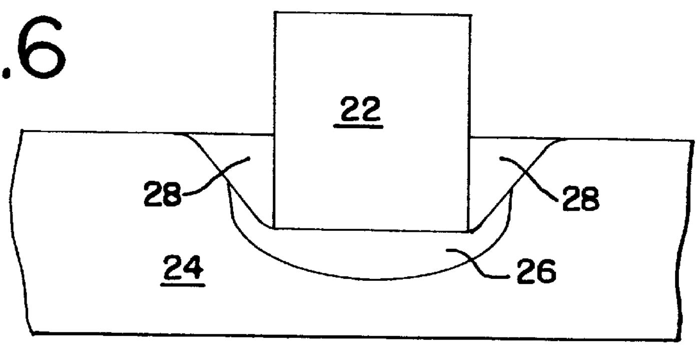

Referring to FIG. 5, after the silicon oxide layer 42 is formed, to form the bit-line oxide region 22, a CMP process is used to planarize the silicon oxide layer 42 to an upper surface 43 of the silicon nitride layer 38. Referring to FIG. 6, thereafter, the silicon nitride layer 38 is removed, for example, with phosphoric acid. In addition, the pad silicon oxide layer 36 is removed, for example, by dry etching with hydrofluoric acid.

Figure 7:
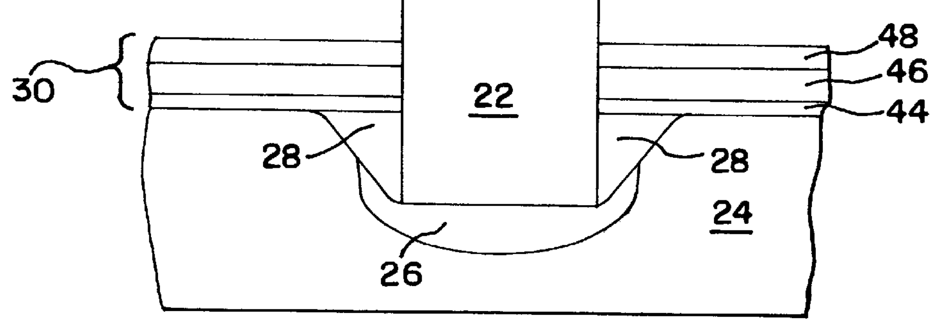

Referring to FIG. 7, after the pad silicon oxide layer 36 is removed, the ONO structure 30 is grown to overlie the semiconductor substrate 24. ONO structure 30 includes a first silicon oxide layer 44 overlying semiconductor substrate 24. A silicon nitride layer 46 overlies first silicon oxide layer 44. A second silicon oxide layer (or top oxide layer) 48 overlies silicon nitride layer 46.

Following the formation of ONO structure 30, artisans will appreciate that processing continues by etching the ONO structure in the periphery area (not shown). In addition, a periphery gate oxide (not shown) is grown in the periphery area. The step of growing the periphery gate oxide also activates the implanted boron and arsenic regions in the absence of an annealing step.

Thereafter, the core structure shown in FIG. 2 is further completed by depositing a layer of polycrystalline silicon 32 overlying the top oxide layer 48 of ONO structure 30, and the bit-line oxide 22. In addition, a silicide layer 34 is formed to overlie the polycrystalline silicon layer 32. Thereafter, a polycrystalline silicon gate patterning (not shown) is performed, and the MONOS cell processing continues in a manner known in the art.

From the foregoing description, it should be understood that an improved method of fabricating a MONOS flash cell has been shown and described which has many desirable attributes and advantages. According to the above described embodiments, an unwanted bird's beak feature of the cell can be eliminated. Therefore, stress damage can be eliminated to the semiconductor substrate caused by the bird's beak. In addition, the size of the transistor can be reduced, to reduce an overall circuit size.

It is to be understood that changes and modifications to the embodiments described above will be apparent to those skilled in the art, and are contemplated. It is therefore intended that the foregoing detailed description be regarded as illustrative rather than limiting, and that it be understood that it is the following claims, including all equivalents, that are intended to define the spirit and scope of this invention.

What is claimed is:

1. A process for fabricating a bit-line for a MONOS Flash cell device, the process comprising the steps of:

providing a semiconductor substrate;

growing a pad silicon oxide layer overlying said semiconductor substrate;

forming a silicon nitride layer overlying said silicon oxide layer, said silicon nitride layer having an upper surface;

performing a shallow trench isolation etch to form a trench in said semiconductor substrate;

depositing silicon oxide to fill said trench;

performing a chemical-mechanical-polishing process to planarize said silicon oxide and forming a planar surface continuous with said upper surface of said silicon nitride layer;

removing said silicon nitride layer and said pad silicon oxide layer; and depositing an oxide-nitride-oxide layer to overlie said semiconductor substrates wherein said silicon oxide functions as said bit-line oxide layer.

2. The process of claim 1 further including the steps of:

depositing a polycrystalline silicon layer to overlie said oxide-nitride-oxide layer; and depositing a silicide layer to overlie said polycrystalline silicon layer.

3. The process of claim 1 further including the step of implanting boron and arsenic into the semiconductor substrate after the step of performing said shallow trench isolation etch.

4. The process of claim 3, wherein the step of forming said silicon nitride layer comprises rapid-thermal-chemical-vapor-deposition to form said silicon nitride layer having a thickness of at least 1000 angstroms.

5. The process of claim 3 further including the step of forming a resist layer before performing said step of boron and arsenic implantation.

6. The process of claim 5, wherein the step of forming said silicon nitride layer comprises rapid-thermal-chemical-vapor-deposition to form said silicon nitride layer having a thickness of about 100 to about 1000 angstroms.

7. The process of claim 1 wherein the step of depositing silicon oxide to fill said trench comprises using a plasma-enhanced-chemical-vapor-deposition process carried out at a temperature of about 400° C.

8. The process of claim 7 further including the step of performing a thermal anneal after said step of depositing said silicon oxide, wherein said step of thermal anneal is accomplished at about 900° C.

9. The process of claim 1 wherein the step of depositing silicon oxide to fill said trench comprises utilizing a high density plasma process.

10. The process of claim 1, wherein the step of depositing said pad silicon oxide layer comprises forming a pad silicon oxide having a thickness of about 50 to about 500 angstroms.

11. The process of claim 1, wherein said trench formed during said step of shallow trench isolation etch has a depth in said semiconductor substrate of about 300 to about 5000 angstroms.

12. A process for fabricating a MONOS Flash cell device including a bit-line, the process comprising the steps of:

providing a semiconductor substrate having at least one bit-line oxide layer;

forming the bit-line by first growing a pad silicon oxide layer overlying said semiconductor substrate, second, forming a silicon nitride layer overlying said silicon oxide layer, third, performing a shallow trench isolation etch to form a trench in said semiconductor substrate, fourth, depositing silicon oxide to fill said trench, fifth, performing a chemical-mechanical-polishing process to planarize said silicon oxide and forming a planar surface continuous with an upper surface of said silicon nitride layer, and sixth, removing said silicon nitride layer and said pad silicon oxide layer;

depositing an oxide-nitride-oxide layer to overlie said semiconductor substrate;

depositing a polycrystalline silicon layer to overlie said oxide-nitride-oxide layer; and depositing a silicide layer to overlie said polycrystalline silicon layer.

13. The process of claim 12 further including the step of implanting boron and arsenic into the semiconductor substrate after the step of performing said shallow trench isolation etch.

14. The process of claim 12, wherein the step of forming said silicon nitride layer comprises rapid-thermal-chemical-vapor-deposition to form a said silicon nitride layer having a thickness of at least 1000 angstroms.

15. The process of claim 12 further including the step of forming a resist layer before performing said step of boron and arsenic implantation.

16. The process of claim 15, wherein the step of forming said silicon nitride layer comprises rapid-thermal-chemical-vapor-deposition to form a said silicon nitride layer having a thickness of about 100 to about 1000 angstroms.

17. The process of claim 12 wherein the step of depositing silicon oxide to fill said trench comprises using a plasma-enhanced-chemical-vapor-deposition process carried out at a temperature of about 400° C.

18. The process of claim 17 further including the step of performing a thermal anneal after said step of depositing said silicon oxide, wherein said step of thermal anneal is accomplished at about 900° C.

19. The process of claim 12 wherein the step of depositing silicon oxide to fill said trench comprises utilizing a high density plasma process.

20. The process of claim 12, wherein the step of depositing said pad silicon oxide layer comprises forming a pad silicon oxide having a thickness of about 50 to about 500 angstroms.

21. The process of claim 12, wherein said trench formed during said step of shallow trench isolation etch has a depth in said semiconductor substrate of about 300 to about 5000 angstroms.

* * * * *